United States Patent
Fain et al.

(10) Patent No.: US 7,885,702 B2
(45) Date of Patent: Feb. 8, 2011

(54) SEGMENTATION OF THE AIRWAY TREE USING HYPERPOLARIZED NOBLE GASES AND DIFFUSION WEIGHTED MAGNETIC RESONANCE IMAGING

(75) Inventors: Sean B. Fain, Madison, WI (US); Eric T. Peterson, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 1245 days.

(21) Appl. No.: 11/406,593

(22) Filed: Apr. 19, 2006

(65) Prior Publication Data

US 2007/0249931 A1   Oct. 25, 2007

(51) Int. Cl.
    *A61B 5/05*   (2006.01)
(52) U.S. Cl. .................... 600/410; 600/407; 600/409; 600/420; 382/128; 382/173
(58) Field of Classification Search ................ 600/420, 600/424; 324/9.3
    See application file for complete search history.

(56) References Cited

U.S. PATENT DOCUMENTS

| | | | |
|---|---|---|---|
| 5,492,123 A * | 2/1996 | Edelman ................ | 600/410 |
| 5,789,921 A | 8/1998 | Albert et al. | |
| 6,241,966 B1 | 6/2001 | Albert et al. | |
| 6,338,836 B1 | 1/2002 | Kuth et al. | |
| 6,370,415 B1 | 4/2002 | Weiler et al. | |
| 6,556,696 B1 * | 4/2003 | Summers et al. ........... | 382/128 |
| 6,589,506 B2 | 7/2003 | Cremillieux et al. | |
| 7,174,200 B2 * | 2/2007 | Salerno et al. ............. | 600/420 |
| 2001/0031242 A1 | 10/2001 | Cremillieux et al. | |
| 2002/0023162 A1 | 2/2002 | Ahn et al. | |
| 2002/0043267 A1 | 4/2002 | Weiler et al. | |
| 2002/0198449 A1 * | 12/2002 | Baumgardner et al. ...... | 600/420 |
| 2004/0260173 A1 | 12/2004 | Salerno et al. | |

OTHER PUBLICATIONS

Van Beek et al (Assessment of lung ventilation by MR imaging: current status and future perspectives).*
G.H. Mills et al; Functional Magnetic Resonance Imaging Of The Lung; British Journal of Anaesthesia 91(1):16-30 (2003).

* cited by examiner

*Primary Examiner*—Long V Le
*Assistant Examiner*—Joel F Brutus
(74) *Attorney, Agent, or Firm*—Quarles & Brady LLP

(57) ABSTRACT

Diagnostic MR images of the lung are segmented to distinguish the airway tree from lung parenchyma. Diffusion weighted images of the lungs are acquired using hyperpolarized gas MRI and a segmentation image is produced from the apparent diffusion coefficient (ADC) image calculated from the diffusion weighted images. Voxels in the diagnostic MR images having an ADC above a selected amount are segmented as being in the airway tree.

16 Claims, 4 Drawing Sheets

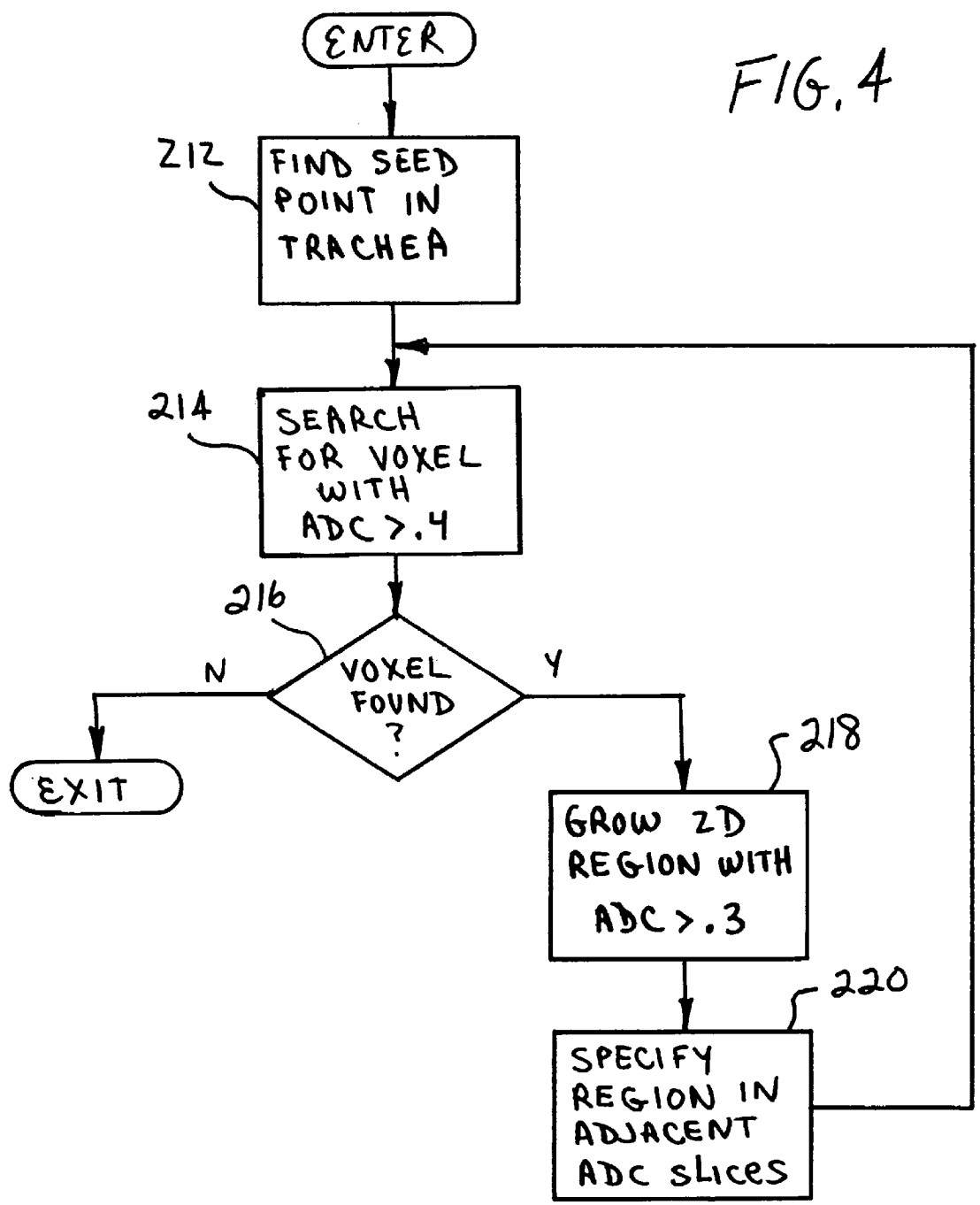

SEGMENTATION OF THE AIRWAY TREE USING HYPERPOLARIZED NOBLE GASES AND DIFFUSION WEIGHTED MAGNETIC RESONANCE IMAGING

BACKGROUND OF THE INVENTION

The field of the invention is nuclear magnetic resonance imaging (MRI) methods and systems. More particularly, the invention relates to MR imaging of the lungs.

Emphysema is characterized by a breakdown in the alveolar walls of the lung. The diagnosis of emphysema is typically made using the whole lung pulmonary function tests and is characterized by increases in airway obstruction and diffusion abnormalities. To quantify regional emphysematous changes in the lung, high resolution x-ray CT images typically are used to measure the fraction of the lung with Hounsfield Units (HU) below a given threshold. The voxels below this threshold contain mostly air and thus are likely regions of the disease. Breath-hold high speed x-ray CT enables a direct visualization of the lung tissue, but it does not provide physiological information that differentiates between disease induced conditions that arise from emphysema, asthma and other lung diseases. Repeated x-ray CT examination to follow the progression of a lung disease is also limited due to the exposure to ionizing radiation.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

A number of MR imaging techniques have been discovered which provide physiological information about the lungs that enable early diagnosis of diseases and the evaluation of disease progression. These methods have been limited by the low signal-to-noise ratio (SNR) signal from the highly aerated lung tissue. More recently, however, interest in MR imaging of the lungs has increased due to the use of noble gases. A noble gas such as Xenon-129 or Helium-3 is inhaled into the lungs prior to the MRI scan to increase SNR of the NMR signals received at the appropriate Larmor frequency. The noble gas is thermally or equilibrium polarized and is preferably hyperpolarized to produce a strong NMR signal when excited at its Larmor frequency. Such imaging methods are disclosed, for example, in U.S. Pat. Nos. 5,789,921; 6,241,966; 6,338,836; 6,370,415; 6,589,506 and in published U.S. Pat. Appln. Nos. 2001/0031242; 2002/0043267; 2002/0198449; 2003/0023162 and 2004/0260173.

Diffusion-weighted imaging (DWI) is a powerful MRI technique for probing microscopic tissue structure. In DWI, a pulse sequence is employed which contains a magnetic field gradient known as a diffusion gradient that sensitizes the MR signal to spin motion. In a DWI pulse sequence the detected MR signal intensity decreases with the speed of spin diffusion in a given volume. The first moment of this diffusion gradient, also known as the "b-value" determines the speed of diffusion to which the image is sensitive. This b-value may be adjusted by either varying the area of the two lobes of the diffusion magnetic field gradient, or by varying the time interval between them. When spin motion in the subject is unrestricted, the MR signal intensity at the center of the echo using a spin-echo diffusion-weighted pulse sequence is related to the b-value as follows:

$$A = \frac{S(b)}{S_0} = e^{-bD} \qquad (1)$$

where the "b-value" $b=\gamma^2 G^2 \delta^2 (\Delta-\delta/3)$. The parameter $\gamma$ is the gyromagnetic ratio of the excited spin species and G is the amplitude of the applied diffusion magnetic field gradients. S(b) is the MR signal magnitude with diffusion weighting b, and $S_0$ is the MR signal magnitude with no diffusion weighting (b=0). The parameter D is the diffusion coefficient of the fluid (in mm²/s), which directly reflects the fluid or gas viscosity where there are no structural restrictions to diffusion of the water or gas. $\Delta$ is the time interval between the onsets of the two diffusion gradient lobes and $\delta$ is the duration of each gradient lobe. The diffusion coefficient D in equation (1) may be calculated, since b is known and the attenuation A can be measured.

$$D = \ln\left(\frac{S_o}{S(b)}\right)/b \qquad (2)$$

The diffusion coefficient D when measured in the presence of structure that restricts diffusion is called the "apparent diffusion coefficient" or "ADC".

Recently, ADC images of the lungs have been produced using DWI methods. One of the difficulties, however, in using such MRI images for diagnostic purposes is the inability to discern the boundary between the highly aerated lung tissues and the respiratory bronchioles which these tissues surround. The measurements that can be made with MR imaging techniques have vastly different meaning depending on whether the measured voxel resides in an air way or tissue. With the ADC measurement, for example, the diffusion of water in blood is measured in tissue, whereas the diffusion of a noble gas is measured in the air spaces of the airway tree. Many lung diagnostic images depend on depiction of the airway tree, both for detection of abnormal morphology and for locating sites of disease. Therefore, there is a need for a procedure that enables a segmented image to be produced which can be registered with diagnostic MR images and which enables the airway tree in the lungs to be delineated in such images.

SUMMARY OF THE INVENTION

The present invention is a method for producing a segmented image that can be registered with an MR diagnostic image to delineate between voxels therein which are part of the airway tree and voxels therein which are part of the surrounding parenchyma. More specifically, the invention includes acquiring diffusion weighted image (DWI) data of the lungs with an MRI system operating at the Larmor frequency of a paramagnetic gas contained in the airway tree, reconstructing an apparent diffusion coefficient (ADC) image of the lungs from the acquired DWI data, and producing a segmented image that identifies voxels in the airway tree as those voxels having an ADC above a preselected level. This segmented image may be easily registered with an MRI diagnostic image acquired during the same scan to segment the airway tree voxels from the parenchyma voxels.

By imaging paramagnetic gas spins rather than hydrogen, significant NMR signal is received from voxels located in the airway tree and voxels located in tissue containing alveoli. The resulting ADC values for those voxels containing only tissues will be very low. In addition, it has been discovered that although significant NMR signals are produced by the alveolar sacs in lung tissue, because of their small size the ADC values are much lower than airway tree voxels. Whereas the ADC values of a free, helium-air mixture will range between 0.7 and 1.0, the ADC of the same mixture in an alveolar sac is usually less than 0.3.

BRIEF DESCRIPTION OF THE DRAWINGS

FIG. 4 is a flow chart of the steps used to calculate the segmentation image that forms part of the method of FIG. 3.

DESCRIPTION OF THE PREFERRED EMBODIMENT

Figure 1:
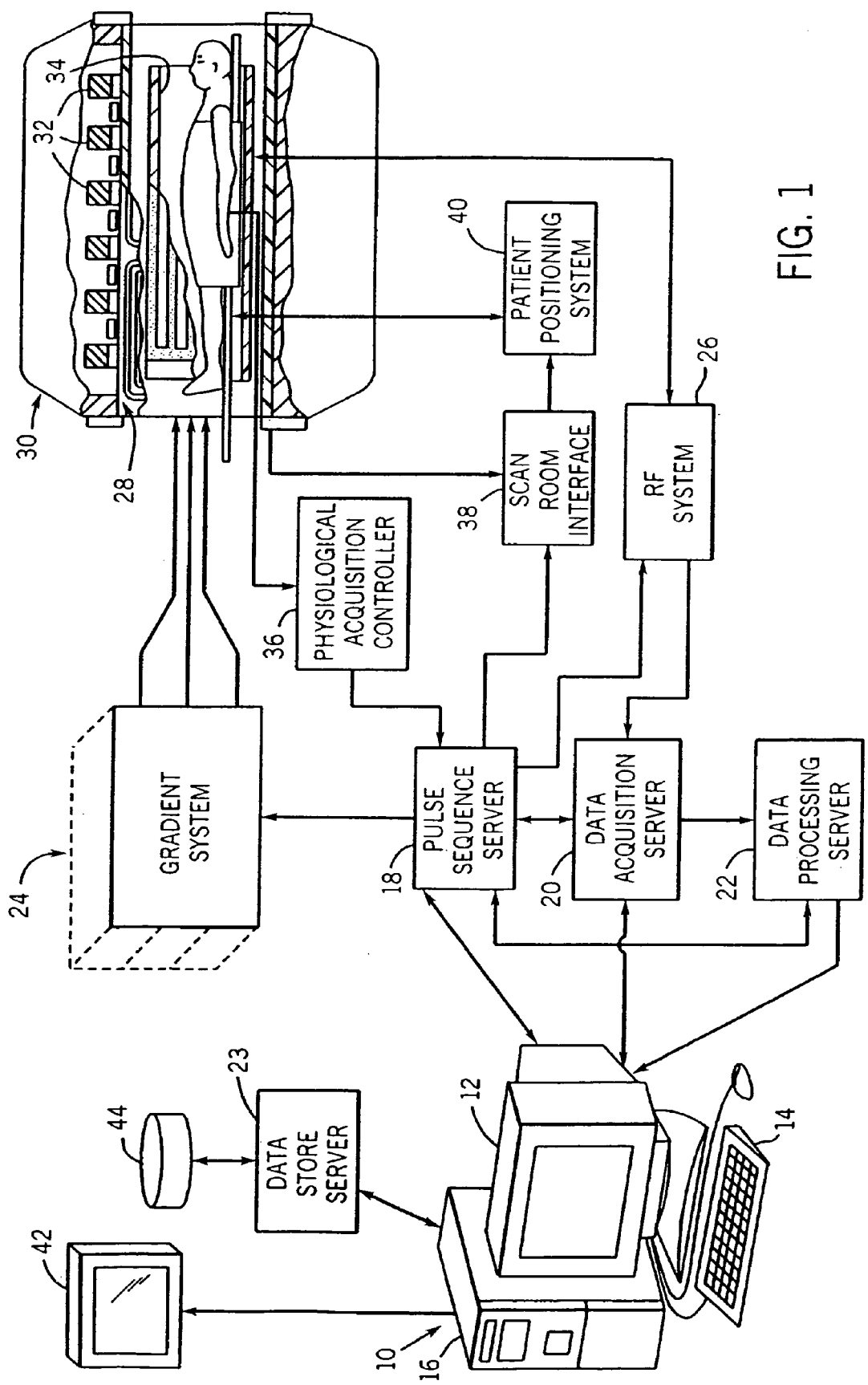
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2}, \quad (3)$$

and the phase of the received NMR signal may also be determined:

$$\phi=\tan^{-1} Q/I. \quad (4)$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
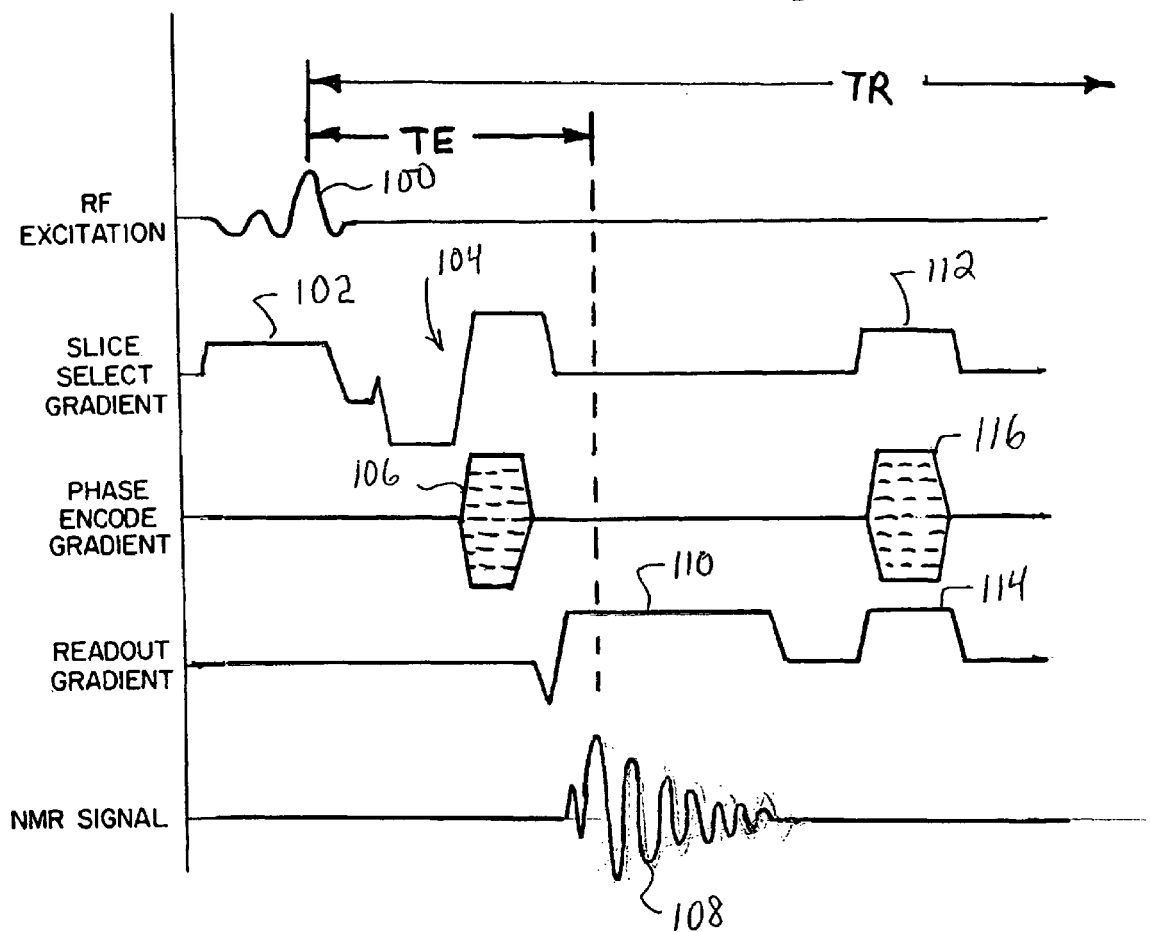
FIG. 2 is a graphic representation of a preferred DWI pulse sequence used by the MRI system of FIG. 1 to practice the present invention.

Referring particularly to FIG. 2, in the preferred embodiment of the present invention a two-dimensional multi-slice SPGR pulse sequence is employed to acquire diffusion weighted image data. An rf pulse 100 with a flip angle of 7° produces transverse magnetization in a 1.5 cm thick slice determined by a slice select gradient waveform 102. A bipolar diffusion encoding gradient waveform 104 is then applied along the slice select gradient axis and a phase encoding gradient 106 is applied to position encode an acquired NMR signal 108 along the phase encoding axis. The NMR signal 108 is acquired in the presence of a readout gradient 110 that position encodes the signal 108 along the readout axis. The echo time TE of this readout is 4.5 msec. and to further shorten the scan time a partial echo is acquired. After the readout, spoiler gradients 112 and 114 are applied along the respective slice select and readout gradient axes and a rewinder gradient pulse 116 is applied along the phase encoding axis. The pulse sequence is repeated with a TR=8.4 msec and the phase encoding gradient 106 and its equal but opposite rewinder gradient 116 are stepped through a set of values to sample a 128×80 array of k-space samples in each of 13 slices. The NMR signal 108 is acquired with a ±15.63 kHz readout bandwidth and the frequency of the rf excitation pulse 100 is the Larmor frequency of the noble gas He-3 at the 1.5T polarization field magnitude (48.6 MHz). If Xe-129 is used, the Larmor frequency is 17.7 MHz.

At each phase encoding in each slice two NMR signals 108 are acquired. In one repetition of the pulse sequence the diffusion encoding gradient 104 is applied with b=1.6 s/cm$^2$, where the width $\Delta$ of each gradient lobe is 1.46 ms and the time between the centers of each gradient lobe is $\delta$=1.46 ms. The same pulse sequence is then repeated with no diffusion encoding gradient 104 applied (b=0).

It should be apparent to those skilled in the art that many other DWI pulse sequences can be used. It is contemplated that highly undersampled 3DPR pulse sequences such as those disclosed in U.S. Pat. No. 6,954,067 will become available that enable three-dimensional images to be acquired with diffusion encoding along a plurality of axes. In the preferred embodiment only one diffusion direction is encoded and airways that are oblique to this direction are not segmented as well as airways oriented along the diffusion encoding axis. This limitation is eliminated by acquiring DWI data sets that are diffusion encoded along a plurality of different directions.

Figure 3:
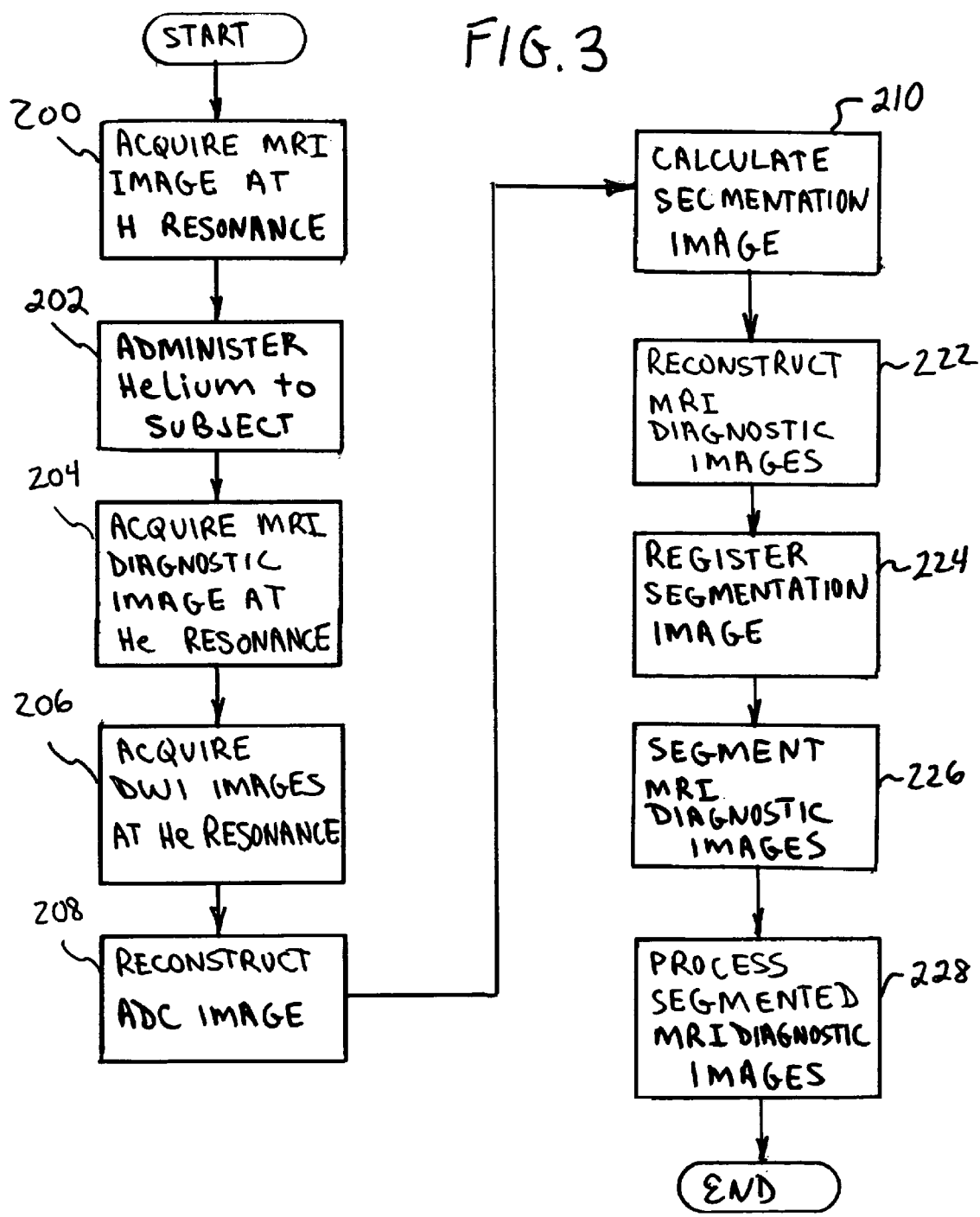
FIG. 3 is a flow chart of the steps performed on the MRI system of FIG. 1 to practice a preferred embodiment of the present invention.

Referring particularly to FIG. 3, the present invention is employed in connection with an MRI examination of a subject's lungs. Such an examination typically will include the acquisition of an MRI diagnostic image of the lung tissues as indicated at process block 200. Such an examination may include a proton density image of water in the tissue, or it may be a DWI or PWI acquisition of the lung tissue or a functional image of ventilation. In any case, the examination is performed at the Larmor frequency of hydrogen.

In the alternative, or in addition to the hydrogen proton diagnostic image, a MRI diagnostic image may also be acquired at the Larmor frequency of a gas or gases with polarized nuclei or paramagnetic properties after it is introduced into the subject's lungs. As indicated at process block 202, the first step in such an acquisition is to administer the paramagnetic gas, in this case helium, to the subject. A helium polarizer commercially available from GE Healthcare as the model IGI.9600 is used in a spin exchange optical pumping procedure to polarize $^3$He to 30-40%. A dose is prepared by combining hyperpolarized $^3$He with nitrogen gas in a 1 L total volume that is purged and rinsed with nitrogen to remove oxygen. The dose of polarized and/or paramagnetic gas is inhaled by the subject through an attached ⅛ inch flexible tube usually starting with their lung volume at functional reserve capacity (FRC). It should be apparent that other gases with polarized nuclei or paramagnetic properties such as xenon-129 or oxygen-18 may also be used and that these gases may be polarized or hyperpolarized using known techniques to increase the NMR signals they produce. Such gases are referred to herein as "NMR responsive gases."

As indicated at process block 204, an MRI diagnostic image is then acquired, followed by the acquisition of DWI data at process block 206 using the above-described pulse sequence. In both cases the rf excitation is set to the Larmor frequency of helium. The MRI diagnostic image may be, for example, a ventilation MRI using a spoiled GRE sequence with +15.63 kHz readout bandwidth, 128×128 image matrix, 14 to 16 slices and a 1.0 cm slice thickness with TR/TE of 6 ms/2.5 ms and a flip angle of 10°. The DWI images are two, one with the diffusion gradient set to b=1.6 s/cm$^2$ and the other with no diffusion gradient b=0 as described above.

As indicated at process block 208, an ADC image is reconstructed from the two DWI image data sets. This is accomplished by performing a two-dimensional complex fast Fourier transformation on each DWI k-space data set and then calculating the magnitude of the NMR signal at each image pixel as set forth above in equation (3). The ADC at each image pixel is then calculated using the above equation (2).

Using the ADC image a segmentation image is calculated next as indicated at process block 210. By combining judicious selection of an ADC threshold level with a region growing algorithm, the airway tree can be readily segmented from the lung parenchyma and background. A recursive guided algorithm described below that mimics three dimensional region growing between the adjacent two-dimensional ADC slice images is employed.

Referring particularly to FIG. 4, this region growing algorithm is initiated by finding a seed voxel in the trachea as indicated at process block 212. A 5×5 voxel region around this seed voxel is specified. The trachea is easily located due to its extremely high ADC values and is obviously in the airway tree. As indicated at process block 214 a search is made within the specified block for a voxel with an ADC greater than 0.4 cm$^2$/s when He-3 gas is employed. If such a voxel is found as determined at decision block 216, a 2D region is grown from this initial seed voxel in one ADC slice image. This 2D region is grown by searching for adjacent voxel ADC values greater than 0.3 cm$^2$/s as indicated at process block 218. When the region is fully grown in one ADC slice image, the process is extended to adjacent slices as indicated at process block 220. This is done by selecting the voxels in the adjacent ADC slice which correspond in location with the grown region in the current slice (i.e. directly above or below). These voxels plus a boundary of 5 voxels are specified and the system loops back to process block 214 to search for a voxel in the newly specified region having an ADC greater than 0.4 cm$^2$/s. It should be apparent that when gases other than He-3 are used, the 0.4 and 0.3 threshold levels will be different because of the different densities and viscosities.

As regions in each ADC slice are grown, their corresponding voxel locations in a segmentation image are set to "1". The region growing is exhausted as determined at decision block 216 when no new voxels with an ADC greater than 0.4 can be found. A segmentation image has been formed at this point in which all of the voxels in the airway tree have been set to "1" and all other voxels are set to "0". It should be apparent that this segmentation image can be inverted by setting the airway tree voxels to "0" and parenchyma voxels to "1".

Returning again to FIG. 3, the MRI diagnostic images are now reconstructed as indicated at process block 222. The manner in which this is done will depend on the nature of the MRI diagnostic image and the manner in which it was acquired. In any event, each reconstructed MRI diagnostic image will include voxels that correspond to voxels in the segmentation image, although they may be misaligned due to patient motion that occurred during the scan. Consequently, the next step as indicated at process block 224 is to register the segmentation image with the MRI diagnostic image. This may be done in a number of ways, but in the preferred embodiment it is accomplished using the magnitude image reconstructed from the DWI image data with no diffusion gradient (b=0) described above, and a magnitude image reconstructed from the MRI diagnostic image data. The former image is translated and rotated until the cross-correlation between the two images is maximized and then the same translations and rotations are made to the segmentation image. If more than one diagnostic image was acquired during the scan, this registration procedure is repeated for each.

The MRI diagnostic image(s) can now be segmented using the registered segmentation image(s) as indicated at process block 226. Where the airway tree voxels in the MRI diagnostic image are desired, this is a simple multiplication of corresponding voxel values in each image. If the lung tissue voxels are desired, then the segmentation image is inverted to switch all of the airway tree voxels to "0" before the multiplication.

As indicated at process block 228 the segmented MRI diagnostic image may be further processed to produce diagnostic information. For example, a segmented ventilation image may be processed to evaluate airway morphology and compliance in obstructive lung disease. In this clinical application a ventilation image is produced using the acquired signals $S_o$ in which no diffusion weighting is applied. The ventilation image is reconstructed as described in U.S. Pat. No. 6,915,151 and discussed in Middleton et al., Mag. Res. Med. 33:271-275 (1995); MacFall et al., Rad 200:553-558 (1996); Kauczor et al., Rad 201:564-568 (1996); Kauczor et al., J. Mag. Res. Imag. 7:538-543 (1997); Roberts et al., Mag. Res. Med. 44(3):379-382 (2000); Black et al., Rad 199(3): 867-870 (1996); de Lang et al., Rad 210(3):851-857(1999); Altes et al., J. Mag. Res. Imag. 13(3):378-384 (2001); Salerno et al., Mag. Res. Med. 46:667-677 (2001); and Gierada et al., NMR Biomed. 13(4):176-181 (2002). The ventilation image is registered with the airway tree image since they are acquired simultaneously, making segmentation of the ventilation image very easy and highly accurate.

Similarly, the airway tree can be used as a map to determine the location of functional anomalies, tumors or other disease. The location of disease with respect to the airway tree can also be used to guide interventions and therapy, particularly with bronchoscopy, or potentially, surgical interventions, including lung volume reduction surgery in chronic obstructive pulmonary disease (COPD). As these techniques mature and fast MRI techniques become more widely available, this technique could readily become the preferred technique for evaluating the physical morphology and properties of the lung airways as it would not expose the subject to ionizing radiation, as CT currently does, and thus multiple measurements could be safely performed to assess mechanical properties of a patient's airways. More importantly, airway morphology in pediatric and even neonatal patients can safely be evaluated. In particular, there are presently no diagnostic tools for distinguishing developmental defects of the lungs from disease of the nervous system in neonates.

In the preferred embodiment a 2DFT pulse sequence is used to measure diffusion along one gradient axis. Many variations are possible. Other pulse sequences such as radial, or projection reconstruction, pulse sequences described in U.S. Pat. No. 6,954,067 can be employed and a single, three-dimensional image can be acquired instead of the series of two-dimensional slice images. Also, diffusion can be measured along two or even three axes rather than a single axis. A three-dimensional image acquisition with three axes of diffusion measurements will become the preferred embodiment of this invention when suitable pulse sequences become available on clinical scanners.

The invention claimed is:

1. A method for segmenting a diagnostic magnetic resonance image of the lung, the steps comprising:
   a) filling the lung with a NMR responsive gas;
   b) acquiring diffusion weighted image (DWI) data from the lung with an MRI system operating at the larmor frequency of the NMR responsive gas;
   c) reconstructing an apparent diffusion coefficient (ADC) image of the lungs from the acquired DWI data;
   d) producing a segmentation image from the ADC image in which voxels therein having an ADC value above a selected value are identified as being in the airway tree; and
   e) using the segmentation image to segment the diagnostic magnetic resonance image.

2. The method as recited in claim 1 in which the NMR responsive gas is a noble gas.

3. The method as recited in claim 2 in which the noble gas is helium.

4. The method as recited in claim 1 which further includes:
f) registering the segmentation image with the diagnostic magnetic resonance image before performing step e).

5. The method as recited in claim 1 in which step d) includes growing regions in the segmentation image having corresponding voxels in the ADC image with ADC values above the selected value.

6. The method as recited in claim 1 in which the diffusion weighted image data is acquired in step b) using a two-dimensional pulse sequence that is repeated to acquire data for a series of two-dimensional slices.

7. The method as recited in claim 6 in which step c) includes reconstructing a series of two-dimensional slice images, and calculating the apparent diffusion coefficient (ADC) at each voxel in each of the series of slice images.

8. The method as recited in claim 7 in which step d) includes;
d)i) locating a voxel in one of the two-dimensional ADC images having a value that is above a first ADC threshold value;
d)ii) growing a region in a corresponding segmentation image that indicates airway tree by locating contiguous voxels in the two-dimensional ADC image that have values above a second ADC threshold value.

9. The method as recited in claim 8 in which the NMR responsive gas is helium and the first ADC threshold value is 0.4 cm$^2$/s and the second ADC threshold value is 0.3 cm$^2$/s.

10. The method as recited in claim 8 in which steps d)i) and d)ii) are repeated for each of the other two-dimensional ADC images having a voxel value above the first ADC threshold value.

11. The method as recited in claim 1 in which the segmentation image indicates at each of its voxels whether the voxel location contains airway or lung tissue.

12. The method as recited in claim 11 in which step e) is performed by multiplying voxel values in the segmentation image by corresponding voxel values in the diagnostic magnetic resonance image.

13. The method as recited in claim 1 in which step b) includes:
b)i) acquiring a first image data set using a pulse sequence that includes a diffusion weighted gradient; and
b)ii) acquiring a second image data set using a pulse sequence with substantially no diffusion weighting gradient.

14. The method as recited in claim 13 in which step c) includes:
c)i) reconstructing a first image from the first image data set;
c)ii) reconstructing a second image from the second image data set; and
c)iii) calculating the ADC at each voxel according to the equation $$ADC = \ln\left(\frac{S0}{S(b)}\right)/b$$

where:
S0=corresponding voxel value in the second image;
S(b)=corresponding voxel value in the first image; and
b=a constant determined by the first moment of the diffusion weighting gradient.

15. The method as recited in claim 13 which includes:
reconstructing a ventilation image from the second image data set.

16. The method as recited in claim 15 which includes:
segmenting the ventilation image using the segmentation image.

* * * * *